US008730562B1

(12) United States Patent
Tauke-Pedretti et al.

(10) Patent No.: US 8,730,562 B1
(45) Date of Patent: May 20, 2014

(54) PARALLEL OPTICAL SAMPLER

(75) Inventors: Anna Tauke-Pedretti, Albuquerque, NM (US); Erik J. Skogen, Albuquerque, NM (US); Gregory A. Vawter, Corrales, NM (US)

(73) Assignee: Sandia Corporation, Albuquerque, NM (US)

( * ) Notice: Subject to any disclaimer, the term of this patent is extended or adjusted under 35 U.S.C. 154(b) by 216 days.

(21) Appl. No.: 13/292,861

(22) Filed: Nov. 9, 2011

(51) Int. Cl.
*G02F 2/00* (2006.01)
*H01S 5/00* (2006.01)

(52) U.S. Cl.
USPC .......................................... 359/325; 359/344

(58) Field of Classification Search
USPC .................... 359/344; 341/155, 347
See application file for complete search history.

(56) References Cited

U.S. PATENT DOCUMENTS

| | | | | |
|---|---|---|---|---|
| 5,955,875 | A * | 9/1999 | Twichell et al. | 324/96 |
| 6,265,999 | B1 * | 7/2001 | Prucnal | 341/137 |
| 6,661,361 | B1 * | 12/2003 | Lewis et al. | 341/137 |
| 7,564,387 | B1 * | 7/2009 | Vawter et al. | 341/137 |

OTHER PUBLICATIONS

Citation of conference paper Skogen et al. "Optical Logic Gates Using Interconnected Photodiodes and Electro-Absorption Modulators", Photonics in Switching, Monterey, California, Jul. 25-28, 2010.*

Soldano et al., "Optical Multi-Mode Interference Devices Based on Self-Imaging: Principles and Applications", Journal of Lightwave Technology, vol. 13, No. 4, Apr. 1995, pp. 615-627.
Gupta et al., "Power Scalling in High Speed Analog-to-Digital Converters using Photonic Time Stretch Technique", Optical Society of America, 2009.
Juodawlkis et al., "Optically Sampled Analog-to-Digital Converters", IEEE Transactions on Microwave Theory and Techniques, vol. 49, No. 10, Oct. 2001.
Tauke-Pedretti et al., "Separate Absorption and Modulation Mach-Zehnder Wavelength Converter", Journal of Lightwave Technology, vol. 26, Jan. 1, 2008.
Henry F. Taylor, "An Optical Analog-to-Digital Converter—Design and Analysis", IEEE Journal of Quantum Electronics, vol. QE-15, No. 4, Apr. 1979.
Skogen et al., "Optical Logic Gates Using Interconnected Photodiodes and Electro-Absorption Modulators", Optical Society of America, 2010.

* cited by examiner

*Primary Examiner* — Eric Bolda
(74) *Attorney, Agent, or Firm* — Helen S. Baca (57) ABSTRACT

An optical sampler includes a first and second 1×n optical beam splitters splitting an input optical sampling signal and an optical analog input signal into n parallel channels, respectively, a plurality of optical delay elements providing n parallel delayed input optical sampling signals, n photodiodes converting the n parallel optical analog input signals into n respective electrical output signals, and n optical modulators modulating the input optical sampling signal or the optical analog input signal by the respective electrical output signals, and providing n successive optical samples of the optical analog input signal. A plurality of output photodiodes and eADCs convert the n successive optical samples to n successive digital samples. The optical modulator may be a photodiode interconnected Mach-Zehnder Modulator. A method of sampling the optical analog input signal is disclosed.

29 Claims, 7 Drawing Sheets

PARALLEL OPTICAL SAMPLER

GOVERNMENT INTEREST STATEMENT

This invention was developed under Contract DE-AC04-94AL85000 between Sandia Corporation and the U.S. Department of Energy. The U.S. Government has certain rights in this invention.

FIELD OF THE INVENTION

The present invention relates in general to an optical sampler for analog to digital conversion, and more specifically, to an optical sampler which can be monolithically integrated on a single integrated circuit (IC) substrate and which uses time delayed parallel sampling.

BACKGROUND OF THE INVENTION

Increased global datacom bandwidth demands have pushed internet transmission system providers to improve aggregate data rates through increased modulation speeds and multi-level signaling. The fidelity of the transmission link may be improved through real time processing of the received optical signal using digital signal processing techniques. Digital signal processing may allow for more of the receiver functions to operate in the digital domain. These include electronic dispersion compensation, error correction, signal conversion, out-of-band rejection, and filtering among other applications. The primary enabler for digital signal processing applications in this context are analog-to-digital converters (ADC).

In particular, high-speed ADCs may enable not only the real-time observation and processing of high-speed optical communications, but also storage of the signal for off-line processing. Such ADCs may also find applications in advanced radar, spread spectrum communications, radio astronomy, and signal transmission for remote antenna systems.

The demands of these systems call for high-bandwidth (>40 GHz), high-resolution ADCs which cannot be met by current electronic analog-to-digital converters (eADC). Although time interleaving could potentially relieve bandwidth demands, the jitter associated with electronic sampling limits the resolution of such configurations.

SUMMARY OF THE INVENTION

The present invention is embodied in an optical sampler monolithically integrated on a single IC substrate and using time delayed parallel sampling. The optical sampler includes n parallel optical modulators each configured to modulate either a) an optical analog input signal or b) an input optical sampling signal by an electrical input signal. The n parallel optical modulators provide n successive optical samples of the optical analog input signal.

According to one aspect, the optical sampler includes n parallel photodiode interconnected Mach-Zehnder Modulators (PD-MZM) each containing a photodiode and a Mach-Zehnder Modulator (MZM). The photodiode converts a respective one of either a) n parallel optical analog input signals or b) n parallel input optical sampling signals to an electrical out signal that is coupled to a branch of the MZM. The electrical output signal modulates a relative phase of two branches of the MZM so that the MZM produces a differential pair of optical output signals.

According to another aspect, the optical sampler includes n semiconductor optical amplifiers (SOA) amplifying either a) n parallel optical analog input signals or b) n parallel input optical sampling signals to provide either a) n parallel amplified optical analog input signals or b) n parallel amplified input optical sampling signals, respectively.

According to another aspect, the method of sampling an optical analog input signal includes splitting an input optical sampling signal into n parallel input optical sampling signals; splitting the optical analog input signal into n parallel optical analog input signals; delaying each parallel optical sampling signal by a respectively different delay, to provide n parallel delayed optical sampling signals relative to the input optical sampling signal; sensing either a) the n parallel delayed optical sampling signal or b) the n parallel optical analog input signal by n photodiodes, respectively, to generate n respective electrical output signals; and modulating either a) the n parallel delayed optical sampling signal or b) the n parallel optical analog input signal with n optical modulators, respectively, to provide n successive optical samples of the optical analog input signal.

BRIEF DESCRIPTION OF THE DRAWINGS

Exemplary embodiments will be explained in greater detail below with reference to Figures, in which.

DETAILED DESCRIPTION OF THE INVENTION

The fast repetition rates, and low jitter of mode locked lasers make optical sampling an attractive alternative. There have been a number of reported methods to optically sample a signal, for example, time-division demultiplex the signal and then use eADCs for quantization and coding, as shown in the following publications.

Gupta et al. (ePrint arXiv:0901.2767, 2009) show the photonic time-stretch technique for a Mode-Locked Laser or Super-Continuum laser can be used to scale eADCs to higher frequencies (time-stretch ADC or TS-ADC). In a time-stretch ADC, the effective bandwidth and frequency of the RF signal to be digitized is compressed by stretching the signal in time, thereby reducing the bandwidth of the backend electronic digitizer required to capture the original signal. To do so, the RF signal is modulated over a long pulse of a linearly chirped optical carrier obtained from a super-continuum source (which can be a femtosecond mode locked fiber laser). Propagation through a dispersive medium stretches the modulated pulse in time, resulting in a "time-stretched" replica of the original RF signal after photodetection. To achieve continuous operation, the optical spectrum is segmented into multiple channels using a wavelength division multiplexing (WDM) filter. Time-stretched signals from different channels are digitized by separate electronic digitizers and combined together in digital domain.

Juodawlkis et al. (IEEE Transactions on Microwave Theory and Techniques, 49(10), p 1840, 2001) show how optically sampled ADCs combine phase-encoded optical sampling technique with electronic quantization to enhance the performance of electronic ADCs with a Mode-Locked Laser pulse source. The narrow-band jitter of actively mode-locked fiber lasers (<10 fs) has been shown to be limited by the phase noise of the laser's electronic reference oscillator, and pulse-to-pulse jitter estimates (<50 fs) indicate the absence of a significant wide-band-noise component. Therefore, optical pulse sources with quantum-limited pulse-to-pulse jitter of <10 fs may be realizable through proper design and the use of low-noise reference oscillators. The low back-electromotive force of electrooptic sampling transducers facilitates the accuracy of the optical sampling process by providing high isolation between the optical clock pulses and the signal being sampled. The advantage of optically sampled ADCs is that the sampling operation can be viewed as a near-perfect mixer, allowing microwave signals to be directly down-converted in the ADC component. For a given jitter-limited resolution, the maximum frequency that can be sampled is limited only by the bandwidth of the sampling modulator and the temporal width of the optical pulses. Thus, it is feasible to undersample signals with frequencies in the range of 100 GHz with 6-b resolution (assuming ~10-fs jitter) using demonstrated modulator and mode-locked laser technologies.

The embodiments described below relate to a simpler configuration which does not use complicated time-division demultiplexing after the optical sampling.

Exemplary embodiments of the present invention are described more fully hereinafter with reference to the accompanying drawings. It is to be understood that although the following description mainly provides a parallel optical sampler, used for analog to digital conversion, having a plurality of parallel optical modulators or optical samplers that avoid complicated time-division demultiplexing in the optical domain as examples, many alterations and changes can be made by those skilled in the art, without deviating from the scope of the invention. This description is not to be taken in a limiting sense, but is made merely for the purpose of illustrating the general principles of the invention.

An optical sampler for analog to digital conversion uses time delayed parallel sampling to avoid complicated time-division demultiplexing in the optical domain. The optical sampler takes advantage of the low jitter and fast repetition rates of mode locked lasers to enable an ADC with an overall higher fidelity and speed than currently available eADCs. Such an ADC may be used in optical transmission links enabling real time processing of the received signal using digital signal processing techniques. These ADCs may also find applications in advanced radar, spread spectrum communications, radio astronomy, and signal transmission for remote antenna systems.

Hereinafter, embodiments of the invention are described with reference to the drawings.

Figure 1:
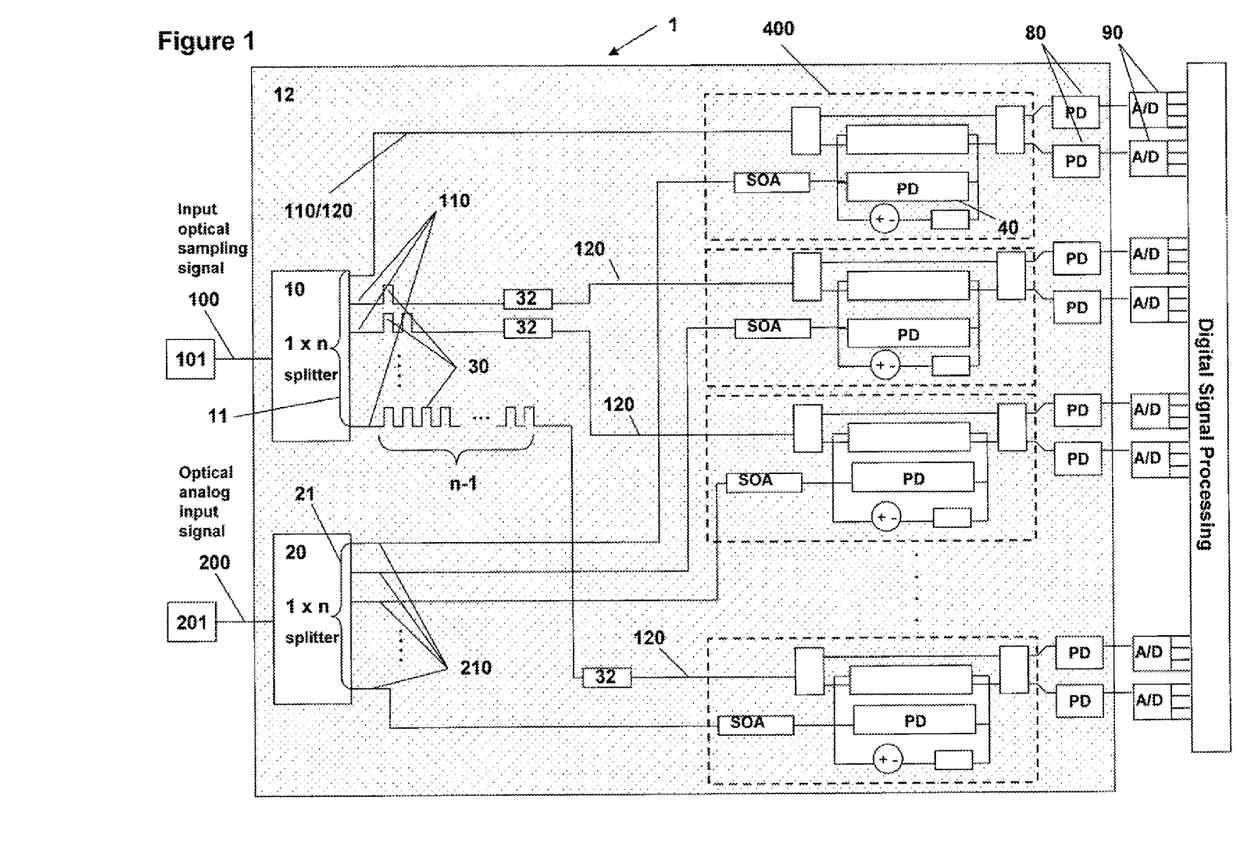
FIG. 1 is a block diagram of an optical sampler on a single IC substrate according to an embodiment of the invention.

An example of an optical sampler 1, as illustrated in FIG. 1, is monolithically integrated on a single IC substrate 12. The example optical sampler 1 works by doing time delayed parallel sampling of an optical analog input signal 200 and generates digital samples of the optical analog input signal 200 provided to the optical sampler 1.

Figure 2:
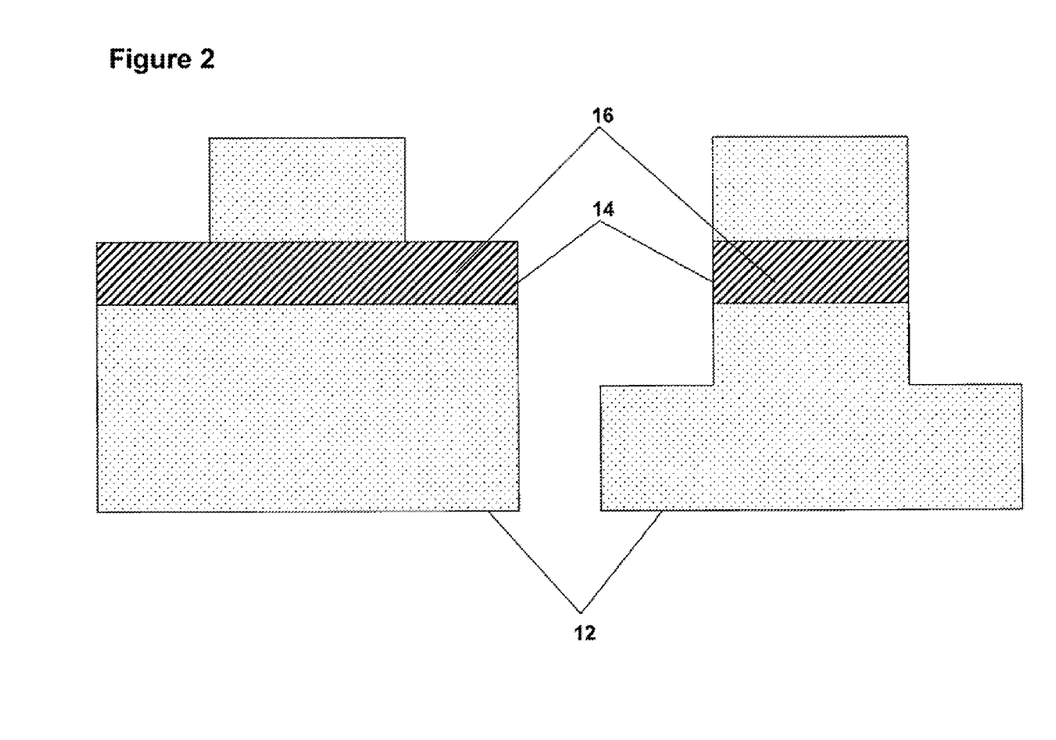
FIG. 2 is schematic side views of an example waveguide of the single IC according to the invention.

The single IC 12 may be a common III-V compound semiconductor substrate such as an indium phosphide (InP) substrate or a gallium arsenide (GaAs) substrate. The single IC 12 may also be a Silicon substrate and all of the optical and electrical devices except for the semiconductor optical amplifiers (SOAs) may be implemented using silicon photonics. The example optical sampler 1 integrated on the single IC 12 forms a waveguide layer 14. The waveguide layer 14 may include an InGaAsP layer, or the like. The waveguide layer 14 may also include quantum wells 16, as shown in FIG. 2.

Referring to FIG. 1, the example optical sampler 1 includes a first 1×n optical beam splitter 10 where n is an integer greater than 1, a second 1×n optical beam splitter 20, a plurality of optical delay elements 30, and n optical modulators 400 including n respective photodiodes 40, monolithically integrated on the single IC 12, forming the waveguide layer 14.

The example optical sampler 1 further includes a plurality of output photodiodes 80 monolithically integrated on the single IC 12, and a plurality of eADCs 90 each following a respective one of the plurality of output photodiodes 80. The eADCs 90 can be displaced outside the single IC 12. The number of the plurality of output photodiodes 80 and eADCs 90 can be n or n pairs, depending on the number of the outputs from the n optical modulators. For example, if there was one output from each of the n optical modulators, then n output photodiodes 80 and n eADCs 90 may be used. If there were two outputs from the each of the n optical modulators, then n pairs of the output photodiodes 80 and n pairs of the eADCs 90 may be used.

The optical analog input signal 200 may be provided, for example, by an optical fiber and may have a radio-frequency (RF) bandwidth (BW) of 40 GHz or more. The optical analog input signal 200 is sampled and converted to the digital sample data 300 at a sampling rate. The sampling rate is chosen to be the Nyquist rate or greater based on the maximum BW of the optical analog input signal 200 to be converted.

The optical analog input signal 200 is sampled by an input optical sampling signal 100 including input optical sampling pulses. The input optical sampling signal 100 may be provided from another optical fiber, or from a semiconductor laser, which can be a mode-locked laser 101 having a repetition rate. The mode-locked laser 101 can be a C-band laser, or other lasers that generate pulses at the desired wavelengths and rates. The repetition rate depends upon the frequency of the optical analog input signal 200 that is being digitized by the example optical sampler 1, and on a desired effective number of n parallel channels 11, 21 that the example optical sampler 1 includes.

The first and second 1×n optical beam splitters 10, 20 may be a y-branch type splitter, a multi-mode interference (MMI) type splitter, or any splitter that is able to be integrated on a monolithic IC substrate and provide n parallel and substantially equal optical beams. The first and second 1×n optical beam splitters 10, 20 split light into the n parallel channels 11, 21, respectively, wherein the n is defined by the BW of the optical analog input signal 200 divided by a BW of the eADCs 90.

Because the values of n is incorporated into the physical design of the example optical sampler 1, it is determined beforehand by the BW of the optical analog input signal 200 that the example optical sampler 1 uses to convert and the BW of the eADCs 90. As an example, n may be 8 if the maximum BW of the optical analog input signal 200 is 40 GHz and the BW of the eADCs 90 is 5 GHz (the corresponding sampling rate of each individual eADC is 10 GHz). Thus, in this example, the first and second 1×n optical beam splitters 10, 20 may be 1×8 optical beam splitters, respectively, integrated on the single IC 12. Furthermore, the repetition rate of the input optical sampling signal 100 including input optical sampling pulses from the mode-locked laser 101 may be 10 GHz, which matches the corresponding sampling rate of each individual eADC (10 GHz).

The first 1×n optical beam splitter 10 is coupled to receive the input optical sampling signal 100 and to provide n substantially equal parallel optical sampling signals 110 to the n parallel channels 11. The second 1×n optical beam splitter 20 is coupled to receive the optical analog input signal 200 and to provide n substantially equal parallel optical analog input signals 210 to the n parallel channels 21.

The plurality of optical delay elements 30 are coupled to receive respectively different ones of the n parallel optical sampling signals 110 to provide n parallel delayed optical sampling signals 120 with respectively different time delays relative to the input optical sampling signal 100.

The plurality of optical delay elements 30 include a plurality of waveguides of respectively different lengths in the waveguide layer 14. The plurality of optical delay elements 30 further include a series of meandering curves or spirals in the waveguides. The plurality of optical delay elements 30 each may also include a biasing electrode 32 configured to fine tune the time delay provided by the optical delay elements 30 by the application of an electrical signal to the biasing electrode 32. The biasing electrode 32 changes the effective refractive index of the waveguides and thus changes the speed of the light traveling through the waveguides to implement a fine adjustment of the delays.

The respectively different time delays of the respectively different ones of the n parallel optical sampling signals 110 are defined by respective values of an expression $(m-1)/S$, where S is the sampling rate of the optical analog input signal 200, m is a respective one of the n parallel channels 11 or 21 and m is an integer where m=1 to n. As an example, if the frequency of the optical analog input signal 200 is 50 GHz, then the sampling rate of the optical analog input signal 200 may be 100 GHz, which is the Nyquist rate of the optical analog input signal 200, thus, the time delay for the first parallel optical sampling signal may be 0 relative to the input optical sampling signal 100. The time delay for the second parallel optical sampling signal relative to the first parallel optical sampling signal may be 10 picoseconds. The time delay for the third parallel optical sampling signal relative to the first parallel optical sampling signal may be 20 picoseconds. The time delay for the nth parallel optical sampling signal relative to the first parallel optical sampling signal may be $10 \times (n-1)$ picoseconds.

Furthermore, the n optical modulators 400, including the respective n photodiodes 40, are integrated on the single IC substrate 12 in parallel. The n optical modulators 400 may be n individual optical samplers integrated on the single IC substrate 12 in parallel. The n individual optical samplers are essentially identical. An optical modulator 400 is described as follows. One of the n parallel delayed input optical sampling signal 120 and one of the n parallel optical analog input signal 210 go to the optical modulator 400. A photodiode 40 is coupled to receive the one of the n parallel optical analog input signals 210 to convert the one of the n parallel optical analog input signals 210 to an electrical output signal. The optical modulator 400 is coupled to receive the one of the n parallel delayed optical sampling signals 120 as an optical input signal. The optical modulator 400 also receives the electrical output signal from the photodiode 40 as the electrical input signal. The optical modulator 400 is configured to modulate the one of the n parallel delayed optical sampling signals 120 by the electrical input signal where the n optical modulators 400 provide n successive optical samples 310 of the optical analog input signal 200.

Furthermore, the plurality of the output photodiodes 80 receive the n successive optical samples 310 of the optical analog input signal 200 and convert the n successive optical samples 310 to n successive electrical samples 320 of the optical analog input signal 200, respectively.

Figure 5:
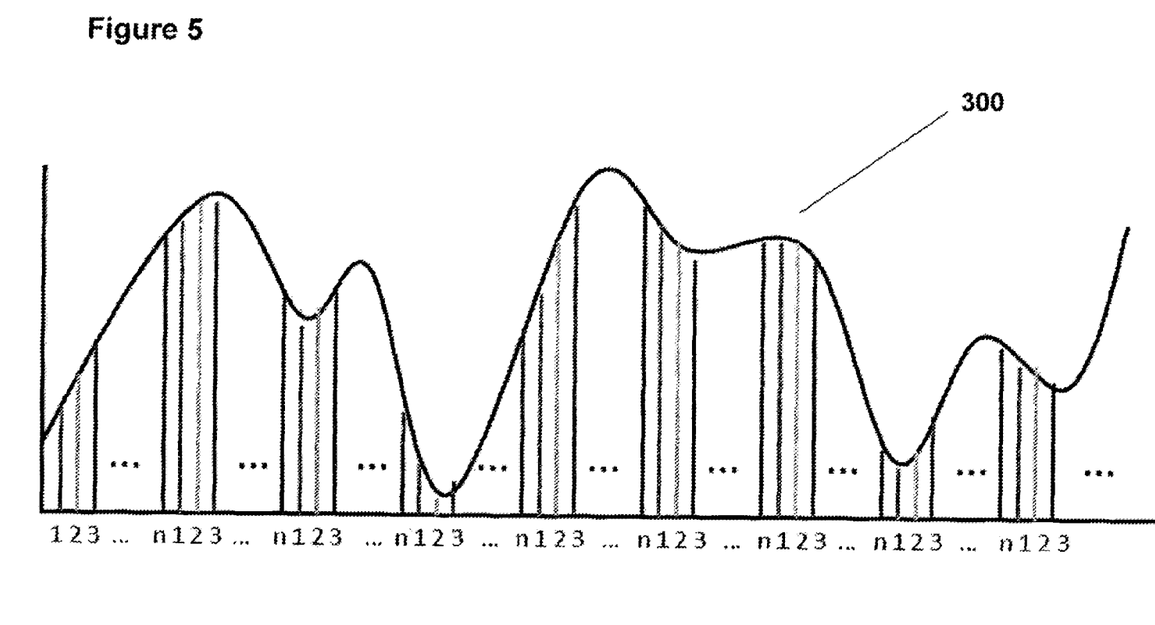
FIG. 5 is a graph of samples generated by each n parallel optical samplers according to an embodiment of the invention.

The plurality of the eADCs 90 receive the n successive electrical samples 320 of the optical analog input signal 200, respectively. Each eADC 90 is connected to a respective one of the n output photodiodes 80. The plurality of the eADCs 90 then digitize the n successive electrical samples 320 and produce n successive digital samples 330 of the optical analog input signal 200. Each of the n successive digital samples 330 is generated at the sampling rate of the individual eADC 90, which matches the repetition rate of the input optical sampling signal 100. The n successive digital samples 330 form the digital signal data 300 which is upsampled to the sampling rate of the optical analog input signal 200, as shown in FIG. 5. The digital signal data 300 may be then processed through digital signal processing circuits (not shown).

In the above embodiment of the example optical sampler 1, each of the n optical modulators 400 samples a different portion of the optical analog input signal 200, as shown in FIG. 5, therefore, the effective sampling rate is the Nyquist rate or greater. The each individual eADC 90, however, deals with a signal at a lower sampling rate appropriate to its BW and maximum sampling rate (2×BW). This approach may be regarded as 1-to-n time-division demultiplexing since a temporal window is created to route every nth pulse to the same channel, thereby reducing the effective data rate into the each individual eADC 90 by a factor of n. Therefore, the example optical sampler 1 for analog to digital conversion uses no complicated time-division demultiplexing in the optical domain after the optical sampling.

Figure 3:
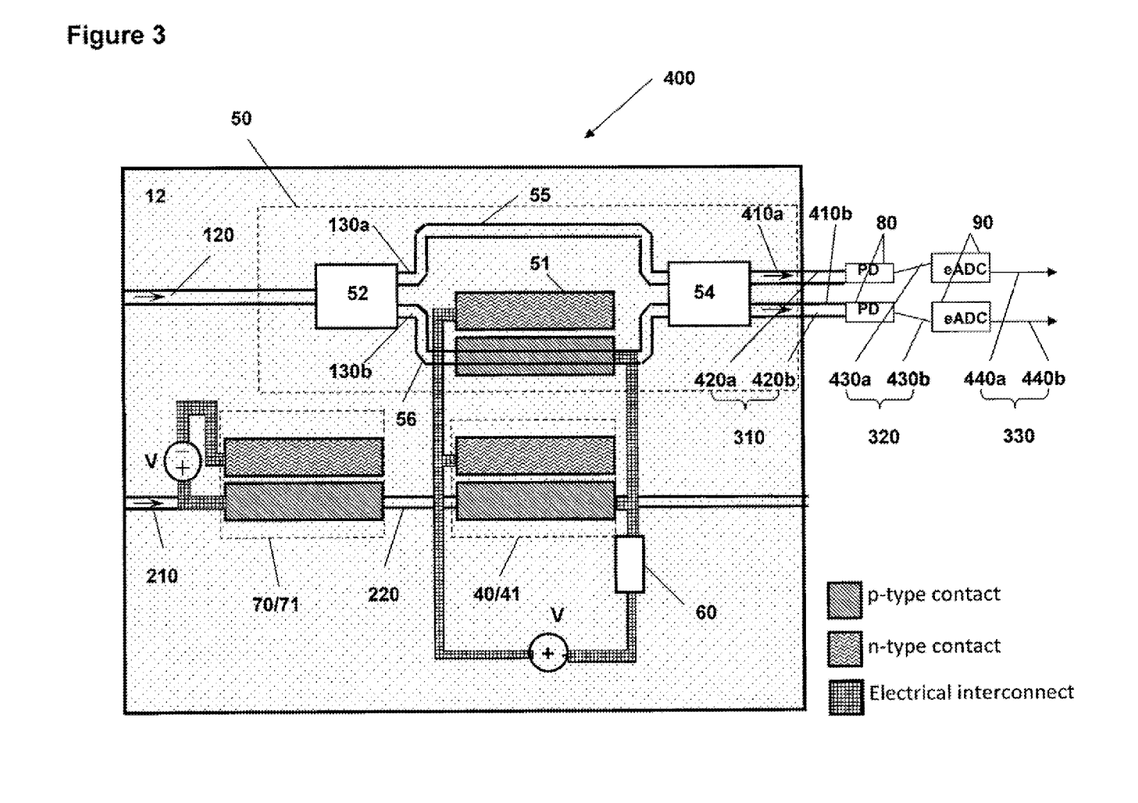
FIG. 3 is a schematic plan view of the photodiode interconnected MZM according to the invention.

In one embodiment of the example optical sampler 1, the n optical modulators 400, each may be a photodiode interconnected Mach-Zehnder Modulator (PD-MZM) 400, as shown in FIGS. 1 and 3. FIG. 3 is a schematic plan view of an individual PD-MZM 400. The PD-MZM 400 is composed of a photodiode 40 coupled to a Mach-Zehnder Modulator (MZM) 50, which may be a traveling-wave modulator for higher bandwidth signals. The example MZM 50 has two complementary modulator outputs 410a, 410b. As shown in FIG. 3, the PD-MZM 400 also includes a SOA 70 provided with an electrode 71 over the optical waveguide biased with the photodiode 40.

Referring to FIG. 3, the individual PD-MZM 400 included in the example optical sampler 1 is described as follows.

The MZM 50 includes a 1×2 optical beam splitter 52. The 1×2 optical beam splitter 52 splits the delayed input optical sampling signals 120 into two substantially equal portions 130a, 130b. Each portion of the delayed optical sampling signals 120 is directed into one of two optical waveguide branches 55, 56 of the MZM 50. The branch 56 is a phase delay branch, whereas the branch 55 has no phase change. The 1×2 optical beam splitter 52 may be the same type of beam splitter as the first and second 1×n optical beam splitters 10, 20, which may be one of a y-branch type splitter, multimode interference (MMI) type splitter, or the like, and is able to be integrated on a monolithic IC substrate.

The MZM 50 further includes an output coupler 54, which may be a "y" coupler or an adiabatic coupler, used to interfere the two branches 55, 56 at the outputs of the MZM 50 leading to the two complementary modulator outputs 410a, 410b.

The photodiode 40 is coupled to receive a respective one of the n parallel optical analog input signals 210 and convert the optical analog input signals 210 to an electrical output signal. The photodiode 40 is formed by doping the optical waveguide to form a PN junction contained in the waveguide and forming an electrode 41 over the PN junction. The electrical output signal from the photodiode 40 is coupled to the phase delay branch 56 of the MZM 50. An electrode 51 is provided over a PN junction in the phase delay branch 56 of the MZM 50 to allow a phase delay to be electrically generated only in the phase delay branch 56 by the respective electrical input signal. The MZM 50 is coupled to receive the electrical output signal from the photodiode 40 as an electrical input signal. The MZM 50 is configured to modulate the respective one of the n parallel delayed optical sampling signals 120 by the electrical input signal and provides an optical sample 310 of the optical analog input signal 200.

The phase delay of the one of the two portions 130a, 130b of the respective one of the n parallel delayed optical sampling signal 120 or the input sampling optical signal 100 generated in the MZM 50 is due to electric field effects. Since the electrical input signal is presented in the phase delay branch 56, the electrical signal output from the photodiode 40 will modulate the voltage on the phase delay branch 56 of the MZM 50 and change the index of the waveguide of the phase delay branch 56 through a number of electric field effects including the Linear Electro-optic Effect (LEO) and Kerr Effect/Quadratic electro-optic effect. Thus, the electrical input signal modulates a relative phase of the two branches 55, 56 of the MZM 50, shifts an optical power splitting ratio between the two complementary modulator outputs 410a, 410b from the MZM 50 so that the MZM produces differential optical output signals 420a, 420b representing the optical sample 310 of the optical analog input signal 200.

Because the MZM 50 has the two complementary modulator outputs 410a, 410b, n pairs of the output photodiodes 80 and n pairs of the eADCs 90 are used to convert the optical samples 310 of the optical analog input signal 200 to the digital samples 330. The n pairs of the output photodiodes 80 may be monolithically integrated in the single IC substrate 12.

A respective pair of the n pairs of the output photodiodes 80 receive a respective differential pair of optical output signals 420a, 420b from the two complementary modulator outputs 410a, 410b of the MZM 50 and convert the respective differential pair of optical output signals 420a, 420b to a respective differential pair of electrical output signals 430a, 430b. The respective differential pair of the electrical output signals 430a, 430b represent an electrical sample 320 of the optical analog input signal 200.

Furthermore, a respective pair of the n pairs of the eADCs 90 are connected to the respective pair of the n pairs of the output photodiodes 80. The respective pair of the n pairs of the eADCs 90 receive the respective differential pair of the electrical output signals 430a, 430b and digitize the respective differential pair of the electrical output signals 430a, 430b to a respective differential pair of digital output signals 440a, 440b. The respective differential pair of the digital output signals 440a, 440b represent the digital sample 330 of the optical analog input signal 200. The digital sample 330 is generated at the sampling rate of the individual eADC 90. The n pairs of the eADCs 90 produce n successive digital samples 330 forming the digital sample data 300, which is upsampled to the sampling rate of the optical analog input signal 200, as shown in FIG. 5. The digital sample data 300 may be then processed through digital signal processing circuits (not shown).

Figure 4:
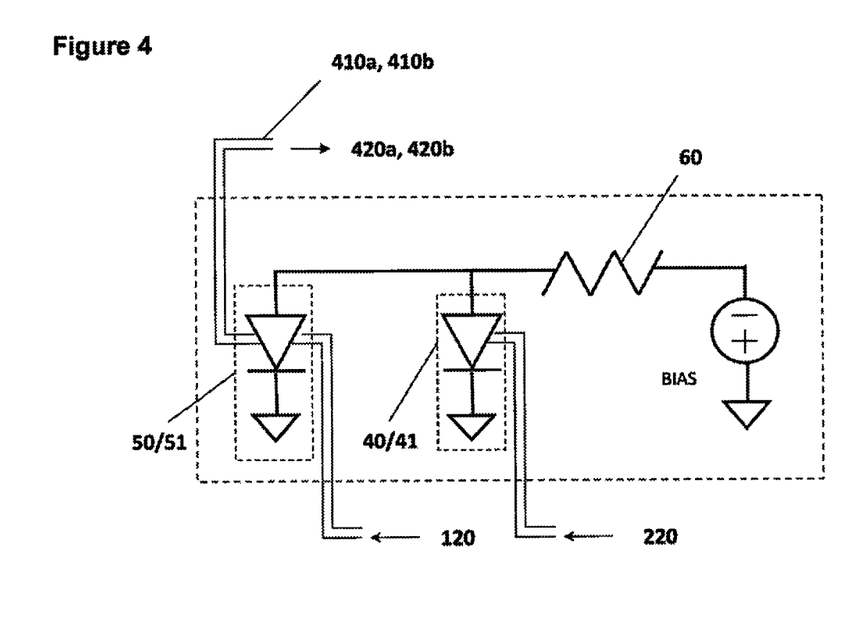
FIG. 4 is a circuit diagram of the connection of PD and MZM in the photodiode interconnected MZM according to the invention.

The optical and electrical connections of the PD-MZM 400 for the example optical sampler 1 are shown in FIGS. 3 and 4. The two branches 55, 56 of the MZM 50 in the waveguide layer 14 have essentially identical lengths. The electrode 41 of the photodiode 40 and the electrode 51 on the phase delay branch 56 of the MZM 50 are electrically connected in parallel with a termination resistor 60 at the end of the electrodes 41, 51. The respective one of the n parallel delayed sampling signals 120 is fed into the beam splitter 52 of the MZM 50 forming the two portions 130a, 130b. Each portion then propagates through the two branches 55, 56 of the MZM 50, respectively. The respective parallel optical analog input signals 210 is absorbed in the photodiode 40 to generate the electrical output signal. The electrical output signal flows through to the electrode 51 extending over the phase delay branch 56 of the MZM 50 to the termination resistor 60, and this generates a voltage on the electrode 51 which reverse biases a semiconductor p-n junction in the phase delay branch 56 therebeneath to produce the phase delay of the one of the two portions 130a, 130b of the respective one of the n parallel delayed input sampling optical signals 120 over the phase delay branch 56 of the MZM 50.

FIG. 3 shows that each pair of the electrodes 41, 51 share a DC power source. In fact, all pairs of the electrode 41 and the electrode 51 in the example optical sampler 1 may use one DC power source provided outside the single IC substrate 12. FIG. 3 also shows that each SOA 70 has its own DC power source. Similarly, all SOAs 70 in the example optical sampler 1 may share another DC power source alone or share the same DC power source as the electrodes 41, 51.

In another alternative embodiment of the optical sampler 1, the optical input signal of the MZM 50 may swap from the respective one of the n parallel delayed optical sampling signals 120 to the respective one of the n parallel optical analog input signals 210, and vice versa. In this embodiment, the respective one of the n parallel delayed optical sampling signals 120 is fed into the photodiode 40, where the respective one of the n parallel delayed optical sampling signals 120 is converted to the respective electrical output signal. The respective one of the n parallel optical analog input signals 210 is fed into the MZM 50 as the optical input signal. The MZM 50 is coupled to receive the electrical output signal as the electrical input signal applied to the phase delay branch 56 of the MZM 50 to produce the phase delay 57 on the phase delay branch 56. Thus, the electrical input signal modulates the relative phase of the two branches 55, 56, and shifts the optical power splitting ratio between the two complementary modulator outputs 410a, 410b so that the MZM 50 produces the differential optical output signals 420a, 420b representing the optical sample 310 of the optical analog input signal 200. In this embodiment, the MZM 50 modulates the respective one of the n parallel optical analog input signals 200 by the electrical input signal.

Optionally, as shown in FIG. 3, in another alternative embodiment of the example optical sampler 1, the SOA 70 is coupled to amplify the respective one of the n parallel optical analog input signals 210 to provide a respective parallel amplified optical analog input signal 220. As described above, the electrical input signal is proportional to the optical analog input signal 200. To provide the electrical input signal for the electrode 51, the respective one of the n parallel optical analog input signals 210 may optionally be amplified with the respective SOA 70. The optical analog input signal 210 may be amplified after the 1×n beam splitter 20 and before being applied to the respective one of the photodiodes 40. After being amplified, the respective parallel amplified optical analog input signal 220 is fed into the photodiode 40, where the respective parallel amplified optical analog input signal 220 is converted to the electrical output signal. The MZM 50 operates in response to the electrical output signal to optical input sampling signal 120 as described above.

Figure 6:
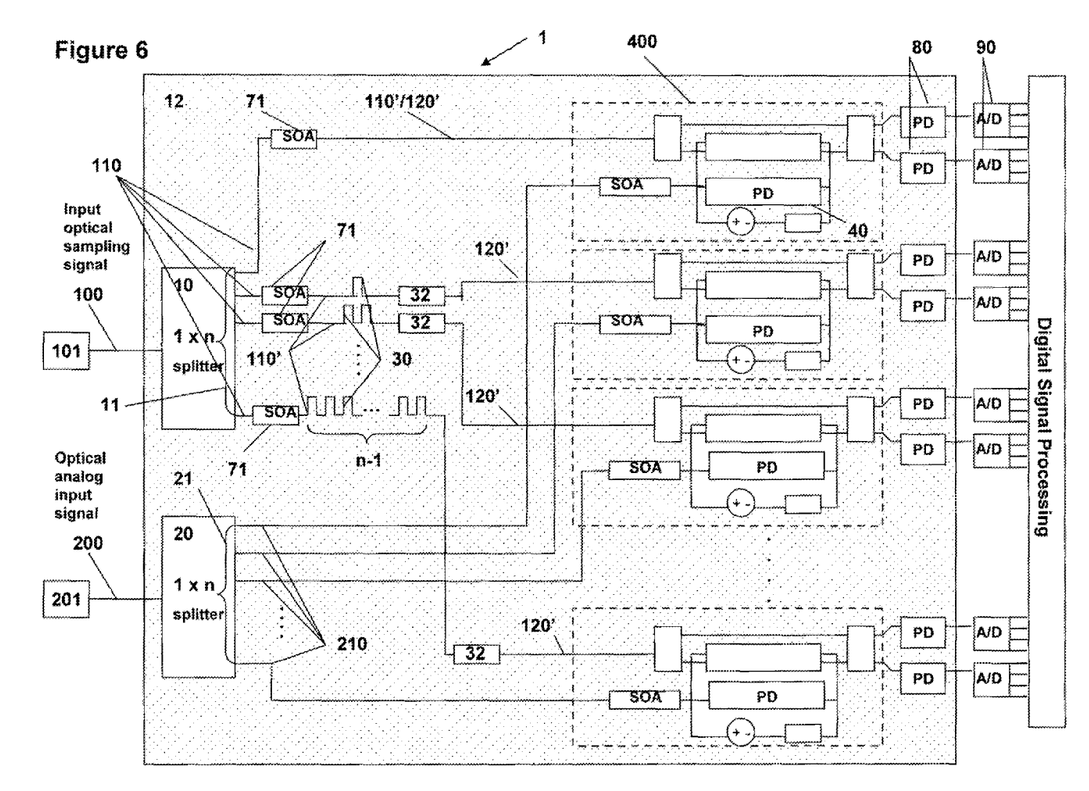
FIG. 6 is a block diagram of the optical sampler on the single IC substrate according to another embodiment of the invention.

Optionally, as shown in FIG. 6, in another alternative embodiment, the example optical sampler 1 may includes another set of n SOAs 71 between the first 1×n beam splitter 10 and the plurality of the delay elements 30, respectively. Each SOA 71 is coupled to amplify a respective one of the n parallel optical sampling signals 110 to provide a respective one of n parallel amplified optical sampling signals 110'. Then, the n parallel amplified optical sampling signals 110' are time delayed to provide n parallel amplified delayed optical sampling signals 120' to the n Mach-Zehnder Modulators 50, respectively.

Optionally, in another alternative embodiment, the example optical sampler 1 may includes another set of n SOAs 71' (not shown) between the first 1×n beam splitter 10 and the plurality of the delay elements 30, respectively. The difference between this embodiment and the embodiment shown in FIG. 6 is the optical input signal of the MZM 50 is the optical analog input signal 210. The n parallel amplified delayed optical sampling signals 120' are provided to the n photodiodes 40, respectively.

Figure 7:
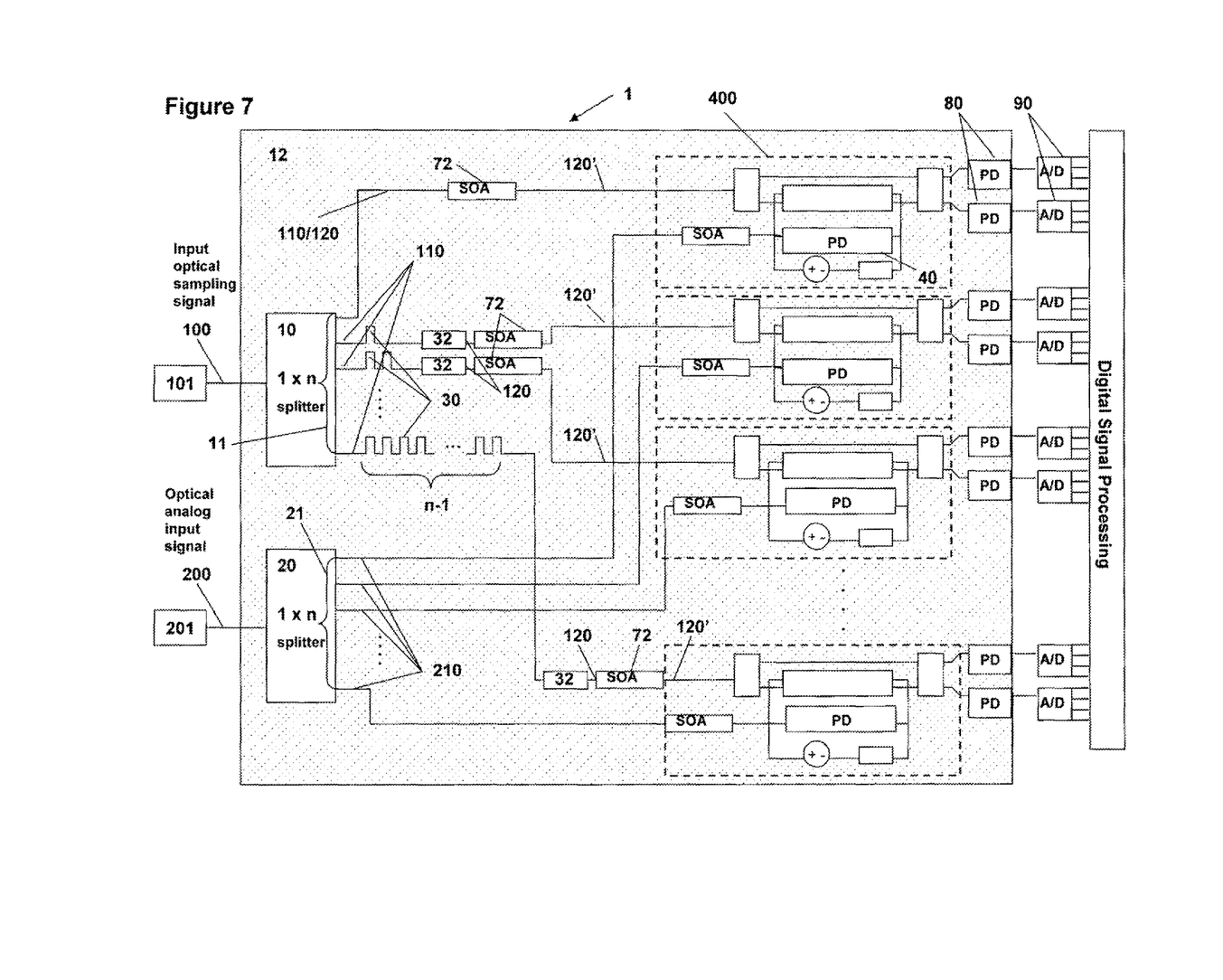
FIG. 7 is a block diagram of the optical sampler on the single IC substrate according to another embodiment of the invention.

Optionally, as shown in FIG. 7, in another alternative embodiment of the optical sampler 1, the example optical sampler 1 may includes another set of n SOAs 72 between the plurality of the delay elements 30 and the n optical modulators 400, respectively. Each SOA 72 is coupled to amplify a respective one of the n parallel delayed optical sampling signals 120 to provide a respective one of n parallel amplified delayed optical sampling signals 120' to the n Mach-Zehnder Modulators 50, respectively.

In another alternative embodiment of the example optical sampler 1, the n optical modulators 400, each may be an Electro-Absorption Modulator (EAM) forming the n parallel optical samplers in the example optical sampler 1. The EAM is based on electroabsorption effect, which is defined as the change of material absorption in the presence of an electric field. The EAM may be integrated on a single chip, and may be made in the form of a waveguide with electrodes for applying an electric field in a direction perpendicular to the modulated light beam. Because an individual EAM provides a single output, in this embodiment, the example optical sampler 1 may include n eADCs 90 connected to n photodiodes 80 that are coupled to the n EAMs on the single IC substrate 12.

All embodiments allow each parallel optical modulator or sampler 400 to sample a different portion of the optical analog input signal 200, as shown in FIG. 5, therefore, the effective sampling rate is the Nyquist rate or greater. The individual eADC 90, however, deals with a signal at a lower sampling rate appropriate to its BW and maximum sampling rate (2×BW). This approach can be regarded as 1-to-n time-division demultiplexing since a temporal window is created to route every nth pulse to the same channel, thereby reducing the effective data rate into each eADC 90 by a factor of n. Therefore, the example optical sampler 1 for analog to digital conversion requires no complicated time-division demultiplexing in the optical domain after the optical sampling. These samples may be multiplexed using an n×1 multiplexer to generate an electrical output signal having a sampling rate at the Nyquist rate of the analog input signal 200 as shown in FIG. 5.

Although the invention is illustrated and described herein with references to specific embodiments, the invention is not intended to be limited to the details shown. Rather, various modifications may be made in the details within the scope and range of equivalents of the claims and without departing from the invention.

What is claimed is:

1. An optical sampler, comprising:
    (i) a first 1×n optical beam splitter where n is an integer greater than 1, coupled to receive an input optical sampling signal, to provide n parallel optical sampling signals;
    (ii) a second 1×n optical beam splitter, coupled to receive an optical analog input signal, to provide n parallel optical analog input signals;
    (iii) a plurality of optical delay elements, coupled to receive respectively different ones of the n parallel optical sampling signals, to provide n parallel delayed optical sampling signals with respectively different time delays relative to the input optical sampling signal; and
    (iv) n optical modulators comprising n photodiodes,
    wherein each n photodiode is coupled to receive a respectively different one of a) the n parallel optical analog input signals or b) the n parallel delayed optical sampling signals and to provide a respective electrical output signal; and
    wherein each n optical modulator is coupled to receive one of a) the n parallel delayed optical sampling signals or b) the n parallel optical analog input signals as an optical input signal, respectively, and to receive the electrical output signal of a respective one of the n photodiodes as an electrical input signal, and wherein the n optical modulators provide n successive optical samples of the optical analog input signal.

2. The optical sampler of claim 1, further comprising:
    n output photodiodes, each coupled to receive optical samples from a respective one of the n optical modulators to provide a respective electrical sample signal; and
    n electrical analog-to-digital converters (eADC), each eADC connected to a respective one of the n output photodiodes to receive a respective electrical sample signal from the one of the n output photodiodes, for producing digital sample data.

3. The optical sampler of claim 1, further comprising:
    n semiconductor optical amplifiers (SOA), each SOA coupled to amplify a respective one of the n parallel optical analog input signals to provide a respective parallel amplified optical analog input signal to a respective one of the n photodiodes.

4. The optical sampler of claim 1, wherein n is defined by a bandwidth of the optical analog input signal divided by a bandwidth of one of the eADCs.

5. The optical sampler of claim 1, wherein the input optical sampling signal is generated from a mode-locked laser.

6. The optical sampler of claim 5, wherein the mode-lock laser is a C-band laser.

7. The optical sampler of claim 5, wherein the input optical sampling signal is generated from the mode-locked laser at a repetition rate defined by S/n where S is a sampling rate of the optical analog input signal.

8. The optical sampler of claim 7, wherein the time delay of the different one of the n parallel optical sampling signals is defined by respective values of an expression (m−1)/S where S is the sampling rate of the optical analog input signal, m is an integer and m=1 to n.

9. The optical sampler of claim 1, wherein the plurality of optical delay elements comprises a plurality of waveguides of respectively different lengths.

10. The optical sampler of claim 1, wherein the plurality of optical delay elements comprises a series of meandering curves or spirals of the waveguides.

11. The optical sampler of claim 10, wherein the plurality of optical delay elements each comprises a biasing electrode configured to fine tune the delay provided by the delay elements by application of an electrical signal.

12. The optical sampler of claim 1, wherein the optical sampler is formed on a single integrated circuit substrate.

13. The optical sampler of claim 12, wherein the optical sampler comprises a waveguide layer formed on an InP substrate and the waveguide layer comprises an InGaAsP layer.

14. The optical sampler of claim 13, wherein the waveguide layer comprises one or more quantum wells.

15. The optical sampler of claim 1, wherein each of the first and second optical beam splitters, independently, is one of a y-branch or a multi-mode interference (MMI) type splitter.

16. The optical sampler of claim 15, wherein each of the first and second optical beam splitters is configured to provide n substantially equal optical output signals.

17. The optical sampler of claim 1, wherein the optical modulator comprises an electro-absorption modulator (EAM).

18. The optical sampler of claim 1, wherein the optical modulator comprises a photodiode interconnected Mach-Zehnder Modulator.

19. The optical sampler of claim 18, wherein the electrical output signal is coupled to one branch of the Mach-Zehnder Modulator and wherein the electrical output signal modulates a relative phase of two branches of the Mach-Zehnder Modulator.

20. The optical sampler of claim 19, further comprising:
n pairs of output photodiodes, each pair of output photodiodes coupled to receive the respective differential optical output signals from a respective one of the n Mach-Zehnder Modulators to provide a respective electrical differential output signal representing an electrical sample of the optical analog input signal; and
n pairs of eADCs, each pair of eADCs connected to a respective one of the n pairs of output photodiodes to receive the respective electrical differential output signal from the Mach-Zehnder Modulator, for producing digital sample data.

21. The optical sampler of claim 19, wherein the photodiode and the Mach-Zehnder Modulator are connected electrically in parallel with a termination resistor at a first electrode of each photodiode.

22. A method of sampling an optical analog input signal, comprising:
splitting an input optical sampling signal into n parallel input optical sampling signals;
splitting the optical analog input signal into n parallel optical analog input signals;
delaying each parallel optical sampling signal by a respectively different delay, to provide n parallel delayed optical sampling signals relative to the input optical sampling signal;
sensing either a) the n parallel delayed optical sampling signal or b) the n parallel optical analog input signal by n photodiodes, respectively, to generate n respective electrical output signals; and
modulating either a) the n parallel delayed optical sampling signal or b) the n parallel optical analog input signal with n optical modulators comprising the n photodiodes, respectively, to provide n successive optical samples of the optical analog input signal.

23. The method of sampling the optical analog input signal of claim 22, further comprising:
converting the n successive optical samples into n analog electrical signals and digitizing the n analog electrical signals to provide n respective digital samples.

24. The method of sampling the optical analog input signal of claim 22, further comprising:
amplifying each of the n parallel optical analog input signals by one of n SOAs and applying each n amplified parallel optical analog input signal to a respective one of the n photodiodes.

25. The method of sampling the optical analog input signal of claim 22, wherein the delaying of each parallel optical sampling signal further comprises delaying each of the n parallel optical sampling signals by a respective delay determined by a respective value of an expression $(m-1)/S$ where S is a sampling rate of the optical analog input signal and m is an integer, $m=1$ to n.

26. The method of sampling the optical analog input signal of claim 22, further comprising:
generating a differential pair of optical sample signals by each of the n optical modulators; and
converting the differential sample signals from each optical modulator into two analog electrical signals and digitizing the two analog electrical signals to provide two respective digital samples.

27. The optical sampler of claim 1, wherein the optical modulator produces two differential optical output signals representing the optical sample of the optical analog input signal.

28. The optical sampler of claim 1, wherein each n photodiode is coupled to receive a) the n parallel optical analog input signals and to provide a respective electrical output signal; and
wherein each n optical modulator is coupled to receive a) the n parallel delayed optical sampling signals as an optical input signal and to receive the electrical output signal of the n photodiodes as an electrical input signal.

29. The optical sampler of claim 1, wherein each n photodiode is coupled to receive b) the n parallel delayed optical sampling signals and to provide a respective electrical output signal; and
wherein each n optical modulator is coupled to receive b) the n parallel optical analog input signals as an optical input signal and to receive the electrical output signal of the n photodiodes as an electrical input signal.

* * * * *